United States Patent
Kim

(10) Patent No.: US 11,495,277 B2
(45) Date of Patent: Nov. 8, 2022

(54) APPARATUS PERFORMING READ OPERATION

(71) Applicant: SK hynix Inc., Icheon-si (KR)

(72) Inventor: Kwang Soon Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/365,636

(22) Filed: Jul. 1, 2021

(65) Prior Publication Data

US 2022/0319563 A1 Oct. 6, 2022

(30) Foreign Application Priority Data

Apr. 1, 2021 (KR) ........................ 10-2021-0043010

(51) Int. Cl.
*G11C 7/22* (2006.01)
*G11C 8/18* (2006.01)
*G11C 7/10* (2006.01)

(52) U.S. Cl.
CPC ............ *G11C 7/222* (2013.01); *G11C 7/1066* (2013.01); *G11C 7/1093* (2013.01); *G11C 8/18* (2013.01)

(58) Field of Classification Search
CPC .................................. G11C 7/222; G11C 7/22

USPC ...................................................... 365/233.1
See application file for complete search history.

(56) References Cited

U.S. PATENT DOCUMENTS

| 8,115,524 | B2* | 2/2012 | Kim ........................ G06F 1/12 327/146 |
| 2011/0227620 | A1* | 9/2011 | Lee ....................... H03L 7/0816 327/158 |
| 2020/0020368 | A1* | 1/2020 | Yoon ...................... G11C 7/222 |

FOREIGN PATENT DOCUMENTS

| KR | 1020180038341 A | 4/2018 |
| KR | 1020200007610 A | 1/2020 |

* cited by examiner

*Primary Examiner* — Muna A Techane
(74) *Attorney, Agent, or Firm* — William Park & Associates Ltd.

(57) ABSTRACT

An apparatus includes a control clock generation circuit configured to generate a first toggling reference clock from a first internal clock and generate a second toggling reference clock from a first inverted internal clock, when a read operation is performed. The apparatus also includes a strobe signal generation circuit configured to generate a data strobe signal whose level transitions during a toggling period in synchronization with the first and second toggling reference clocks.

20 Claims, 13 Drawing Sheets

APPARATUS PERFORMING READ OPERATION

CROSS-REFERENCE TO RELATED APPLICATION

The present application claims priority under 35 U.S.C. § 119(a) to Korean application number 10-2021-0043010, filed in the Korean Intellectual Property Office on Apr. 1, 2021, the entire disclosure of which is incorporated herein by reference in its entirety.

BACKGROUND

1. Technical Field

Embodiments of the disclosure generally relate to an apparatus for performing a read operation.

2. Related Art

A semiconductor device may stably increase the speeds of various internal operations such as a read operation by using a multi-phase clock generated by dividing the frequency of an external clock.

When performing a read operation for transmitting data to the outside, the semiconductor device may transmit, together with the data, a strobe signal having information on data transmission timing, to the outside.

SUMMARY

Various embodiments are directed to an apparatus capable of performing a read operation.

In an embodiment, an apparatus may include: a control clock generation circuit configured to generate a first toggling reference clock from a first internal clock and generate a second toggling reference clock from a first inverted internal clock, when a read operation is performed; and a strobe signal generation circuit configured to generate a data strobe signal whose level transitions during a toggling period in synchronization with the first and second toggling reference clocks, wherein a generation sequence of the first and second toggling reference clocks is changed depending on with which one of the first internal clock and the first inverted internal clock a read command for the read operation is synchronized.

In an embodiment, an apparatus may include: a control clock generation circuit configured to generate a first toggling reference clock from a first internal clock and generate a second toggling reference clock from a first inverted internal clock, when a read operation is performed; and a data output circuit configured to output read data as data in synchronization with the first and second toggling reference clocks, wherein a generation sequence of the first and second toggling reference clocks is changed depending on with which one of the first internal clock and the first inverted internal clock a read command for the read operation is synchronized.

According to an embodiment of the present disclosure, when performing a read operation, by changing, depending on a generation time point of a read command, a path through which a preamble (postamble) control clock for setting a preamble (postamble) pattern of a data strobe signal is generated from an internal clock, it is possible to reduce an area and power consumed in a circuit for setting the preamble (postamble) pattern.

In addition, according to an embodiment of the present disclosure, when performing a read operation, by maintaining, regardless of a generation time point of the read command, a path through which a toggling control clock for toggling the data strobe signal is generated from the internal clock, it is possible to prevent degradation in the characteristics of the data strobe signal generated when the path through which the toggling control clock is generated is changed depending on a generation time point of the read command.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is being performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described in more detail through embodiments. The embodiments are only used to exemplify the teachings of the present disclosure, and the scope of the present disclosure is not limited by the embodiments.

Figure 1:
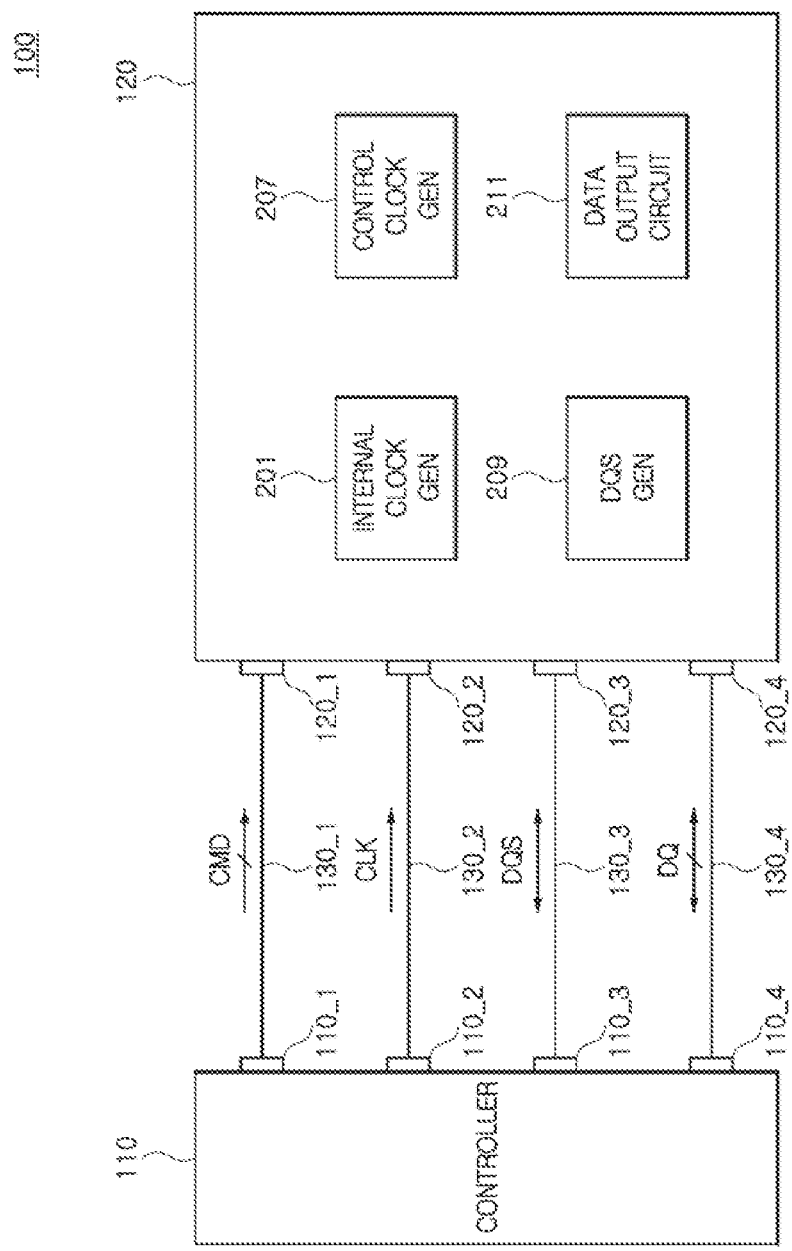
FIG. 1 is a block diagram illustrating a configuration of a system in accordance with an embodiment of the present disclosure.

FIG. 1 is a block diagram illustrating a configuration of a system 100 in accordance with an embodiment of the disclosure. As illustrated in FIG. 1, the system 100 may include a controller (CONTROLLER) 110 and an apparatus 120. The apparatus 120 may be implemented by a semiconductor device.

The controller 110 may include a first control pin 110_1, a second control pin 110_2, a third control pin 1103 and a fourth control pin 110_4. The apparatus 120 may include a first apparatus pin 120_1, a second apparatus pin 1202, a third apparatus pin 120_3 and a fourth apparatus pin 120_4. The controller 110 may transmit a command CMD to the apparatus 120 through a first transmission line 130_1 which is coupled between the first control pin 110_1 and the first apparatus pin 120_1. The number of bits of the command CMD may be variously set depending on an embodiment. The controller 110 may transmit a clock CLK to the apparatus 120 through a second transmission line 130_2 which is coupled between the second control pin 110_2 and the second apparatus pin 120_2. The controller 110 may transmit and receive a data strobe signal DQS to and from the apparatus 120 through a third transmission line 130_3 which is coupled between the third control pin 110_3 and the third apparatus pin 120_3. The controller 110 may transmit and receive data DQ to and from the apparatus 120 through a fourth transmission line 130_4 which is coupled between the fourth control pin 110_4 and the fourth apparatus pin 120_4. The number of bits of the data DQ may be variously set depending on an embodiment.

The apparatus 120 may include an internal clock generation circuit (INTERNAL CLOCK GEN) 201, a control clock generation circuit (CONTROL CLOCK GEN) 207, a strobe signal generation circuit (DQS GEN) 209 and a data output circuit (DATA OUTPUT CIRCUIT) 211. The apparatus 120 may perform various internal operations including a read operation of transmitting the data DQ to the controller 110, based on the command CMD, the clock CLK and the data strobe signal DQS. The apparatus 120 may generate a read command RD (see FIG. 2) by receiving the command CMD having a logic level combination for performing the read operation.

The internal clock generation circuit 201 may receive the clock CLK and thereby generate internal clocks ICLK, QCLK, ICLKB and QCLKB (see FIG. 2) having different phases.

Figure 2:
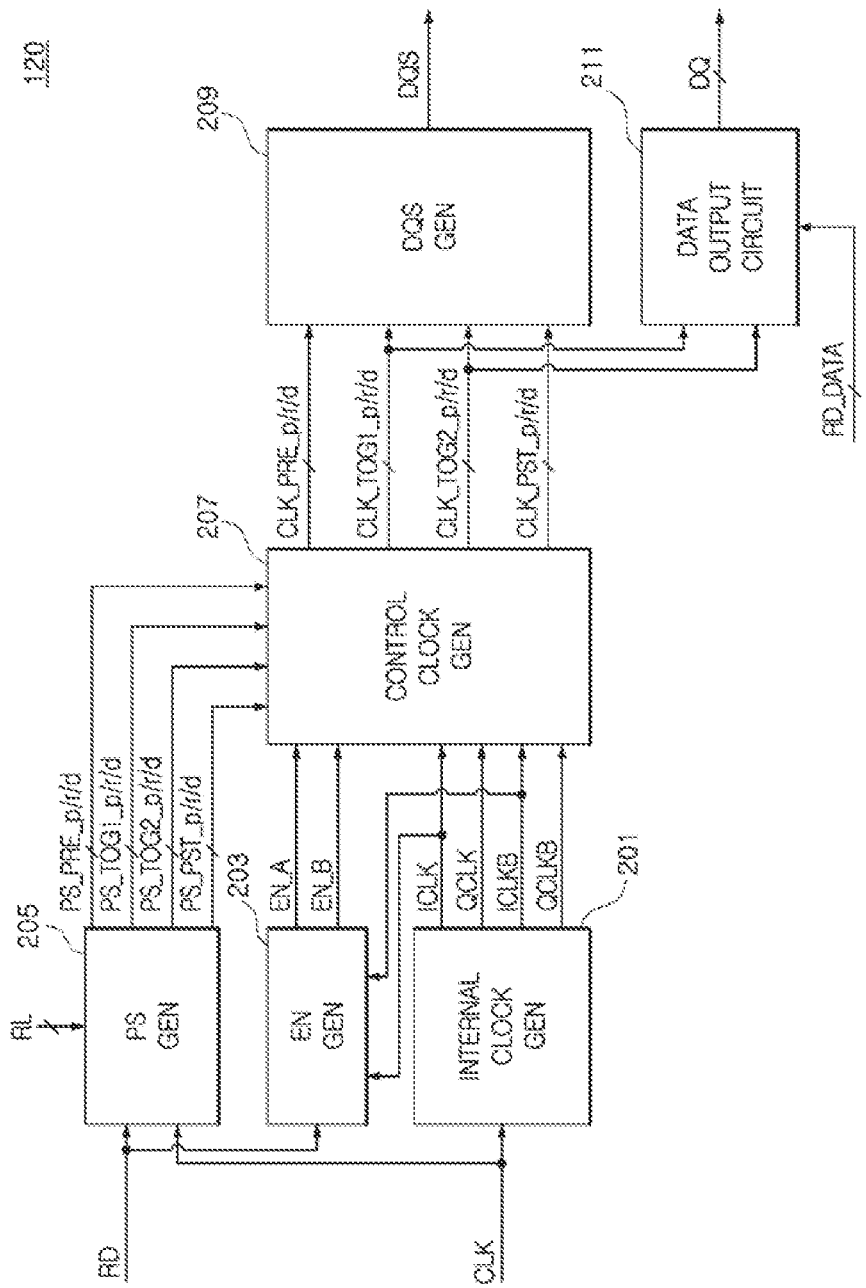
FIG. 2 is a block diagram illustrating a configuration of an embodiment of an apparatus illustrated in FIG. 1.

The control clock generation circuit 207 may change, depending on a generation time point of the read command RD (see FIG. 2), paths through which preamble control clocks CLK_PRE_p/r/d (see FIG. 2) for setting preamble patterns of the data strobe signal DQS are generated from the internal clocks ICLK, QCLK, ICLKB and QCLKB (see FIG. 2). Accordingly, the apparatus 120 may reduce an area and power consumed in a circuit for setting preamble patterns.

The control clock generation circuit 207 may maintain, regardless of a generation time point of the read command RD (see FIG. 2), paths through which toggling control clocks CLK_TOG1_p/r/d and CLK_TOG2_p/r/d (see FIG. 2) for toggling the data strobe signal DQS are generated from the internal clocks ICLK, QCLK, ICLKB and QCLKB (see FIG. 2). Accordingly, the apparatus 120 may prevent degradation in the characteristics of the data strobe signal DQS generated when the paths through which the toggling control clocks CLK_TOG1_p/r/d and CLK_TOG2_p/r/d (see FIG. 2) are generated are changed depending on a generation time point of the read command RD.

The control clock generation circuit 207 may change, depending on a generation time point of the read command RD (see FIG. 2), paths through which postamble control clocks CLK_PST_p/r/d (see FIG. 2) for setting postamble patterns of the data strobe signal DQS are generated from the internal clocks ICLK, QCLK, ICLKB and QCLKB (see FIG. 2). Accordingly, the apparatus 120 may reduce an area and power consumed in a circuit for setting postamble patterns.

The strobe signal generation circuit 209 may output the data strobe signal DQS to the controller 110, based on the preamble control clocks CLK_PRE_p/r/d (see FIG. 2), the toggling control clocks CLK_TOG1_p/r/d and CLK_TOG2_p/r/d (see FIG. 2) and the postamble control clocks CLK_PST_p/r/d (see FIG. 2).

The data output circuit 211 may output the data DQ to the controller 110 in synchronization with the toggling control clocks CLK_TOG1_p/r/d and CLK_TOG2_p/r/d (see FIG. 2).

FIG. 2 is a block diagram illustrating a configuration of an embodiment of the apparatus 120 illustrated in FIG. 1. As illustrated in FIG. 2, the apparatus 120 may include the internal clock generation circuit (INTERNAL CLOCK GEN) 201, an enable signal generation circuit (EN GEN) 203, a period signal generation circuit (PS GEN) 205, the control clock generation circuit (CONTROL CLOCK GEN) 207, the strobe signal generation circuit (DQS GEN) 209 and the data output circuit (DATA OUTPUT CIRCUIT) 211.

The internal clock generation circuit 201 may generate the internal clocks ICLK, QCLK, ICLKB and QCLKB from the clock CLK. The internal clocks ICLK, QCLK, ICLKB and QCLKB may include a first internal clock ICLK, a second internal clock QCLK, a first inverted internal clock ICLKB and a second inverted internal clock QCLKB. The internal clock generation circuit 201 may generate the first internal clock ICLK by dividing a frequency of the clock CLK. The internal clock generation circuit 201 may generate the first inverted internal clock ICLKB by inverting a phase of the first internal clock ICLK. The internal clock generation circuit 201 may generate the second internal clock QCLK by dividing a frequency of an inverted clock (not illustrated). The inverted clock (not illustrated) may be generated by inverting a phase of the clock CLK. The internal clock generation circuit 201 may generate the second inverted internal clock QCLKB by inverting a phase of the second internal clock QCLK. The first internal clock ICLK, the second internal clock QCLK, the first inverted internal clock ICLKB and the second inverted internal clock QCLKB may have a phase difference of 90 degrees from each other. For example, the first internal clock ICLK may have a phase leading the second internal clock QCLK by 90 degrees. The second internal clock QCLK may have a phase leading the first inverted internal clock ICLKB by 90 degrees. The first inverted internal clock ICLKB may have a phase leading the second inverted internal clock QCLKB by 90 degrees. The second inverted internal clock QCLKB may have a phase leading the first internal clock ICLK by 90 degrees. The more detailed operation of the internal clock generation circuit 201 will be described later with reference to FIG. 3.

The enable signal generation circuit 203 may generate an odd enable signal EN_A and an even enable signal EN_B, based on the read command RD, the first internal clock ICLK and the first inverted internal clock ICLKB. The read command RD may be activated from the command CMD (see FIG. 1) for performing the read operation. The enable signal generation circuit 203 may activate the odd enable signal EN_A when the read command RD is inputted in synchronization with the rising edge of the first internal clock ICLK. According to an embodiment, the enable signal generation circuit 203 may activate the odd enable signal EN_A when the read command RD is inputted in synchronization with the falling edge of the first internal clock ICLK. The enable signal generation circuit 203 may activate the even enable signal EN_B when the read command RD is inputted in synchronization with the rising edge of the first inverted internal clock ICLKB. According to an embodiment, the enable signal generation circuit 203 may activate the even enable signal EN_B when the read command RD is inputted in synchronization with the falling edge of the first inverted internal clock ICLKB.

The period signal generation circuit 205 may generate preamble period signals PS_PRE_p/r/d, toggling period signals PS_TOG1_p/r/d and PS_TOG2_p/r/d and postamble period signals PS_PST_p/r/d, based on the read command RD, the clock CLK and a read latency signal RL. The read latency signal RL may be stored in a mode register (not illustrated). The read latency signal RL may be set as a plurality of bits for a read latency period. The read latency period may be set as a period from a time point when the generation of the read command RD is completed to a time point when read data RD_DATA is outputted as the data DQ.

The period signal generation circuit 205 may generate the preamble period signals PS_PRE_p/r/d from the read command RD in synchronization with the clock CLK. The preamble period signals PS_PRE_p/r/d may be generated to set periods in which the preamble control clocks CLK_PRE_p/r/d are activated. The preamble period signals PS_PRE_p/r/d may include a preamble pre-period signal PS_PRE_p (see FIG. 4), a preamble reference period signal PS_PRE_r (see FIG. 4) and a preamble delay period signal PS_PRE_d (see FIG. 4). The preamble reference period signal PS_PRE_r may be generated to set a period in which a preamble reference clock CLK_PRE_r (see FIG. 8) is activated. The preamble reference period signal PS_PRE_r may be activated a first preset period before an ending time point of the read latency period. The first preset period may be variously set depending on an embodiment. The preamble pre-period signal PS_PRE_p may be generated to set a period in which a preamble pre-clock CLK_PRE_p (see FIG. 8) is activated. The preamble pre-period signal PS_PRE_p may be activated prior to the preamble reference period signal PS_PRE_r when the read operation is performed. The preamble delay period signal PS_PRE_d may be generated to set a period in which a preamble delay clock CLK_PRE_d (see FIG. 8) is activated. The preamble delay period signal PS_PRE_d may be activated later than the preamble reference period signal PS_PRE_r when the read operation is performed.

The period signal generation circuit 205 may generate the toggling period signals PS_TOG1_p/r/d and PS_TOG2_p/r/d from the read command RD in synchronization with the clock CLK. The toggling period signals PS_TOG1_p/r/d and PS_TOG2_p/r/d may include first toggling period signals PS_TOG1_p/r/d and second toggling period signals PS_TOG2_p/r/d. The first toggling period signals PS_TOG1_p/r/d may include a first toggling pre-period signal PS_TOG1_p (see FIG. 4), a first toggling reference period signal PS_TOG1_r (see FIG. 4) and a first toggling delay period signal PS_TOG1_d (see FIG. 4). The first toggling reference period signal PS_TOG1_r may be activated at the ending time point of the read latency period. The first toggling pre-period signal PS_TOG1_p may be activated prior to the first toggling reference period signal PS_TOG1_r when the read operation is performed. The first toggling delay period signal PS_TOG1_d may be activated later than the first toggling reference period signal PS_TOG1_r when the read operation is performed. The second toggling period signals PS_TOG2_p/r/d may include a second toggling pre-period signal PS_TOG2_p (see FIG. 4), a second toggling reference period signal PS_TOG2_r (see FIG. 4) and a second toggling delay period signal PS_TOG2_d (see FIG. 4). The second toggling reference period signal PS_TOG2_r may be activated a second preset period after the ending time point of the read latency period. The second preset period may be variously set depending on an embodiment. That is to say, the period signal generation circuit 205 may sequentially activate the first toggling reference period signal PS_TOG1_r and the second toggling reference period signal PS_TOG2_r. The second toggling pre-period signal PS_TOG2_p may be activated prior to the second toggling reference period signal PS_TOG2_r when the read operation is performed. The second toggling delay period signal PS_TOG2_d may be activated later than the second toggling reference period signal PS_TOG2_r when the read operation is performed.

The period signal generation circuit 205 may generate the postamble period signals PS_PST_p/r/d from the read command RD in synchronization with the clock CLK. The postamble period signals PS_PST_p/r/d may be generated to set periods in which the postamble control clocks CLK_PST_p/r/d are activated. The postamble period signals PS_PST_p/r/d may include a postamble pre-period signal PS_PST_p (see FIG. 4), a postamble reference period signal PS_PST_r (see FIG. 4) and a postamble delay period signal PS_PST_d (see FIG. 4). The postamble reference period signal PS_PST_r may be generated to set a period in which a postamble reference clock CLK_PST_r (see FIG. 8) is activated. The postamble reference period signal PS_PST_r may be activated a third preset period after the ending time point of the read latency period. The third preset period may be set to be the same as a period in which the data strobe signal DQS is toggled. In other words, the third preset period may be set as a period in which the read data RD_DATA is outputted as the data DQ from the data output circuit 221 when the read operation is performed. The postamble pre-period signal PS_PST_p may be generated to set a period in which a postamble pre-clock CLK_PST_p (see FIG. 8) is activated. The postamble pre-period signal PS_PST_p may be activated prior to the postamble reference period signal PS_PST_r when the read operation is performed. The postamble delay period signal PS_PST_d may be generated to set a period in which a postamble delay clock CLK_PST_d (see FIG. 8) is activated. The postamble delay period signal PS_PST_d may be activated later than the postamble reference period signal PS_PST_r when the read operation is performed. The detailed operation of the period signal generation circuit 205 will be described later with reference to FIG. 4.

The control clock generation circuit 207 may generate the preamble control clocks CLK_PRE_p/r/d from the internal clocks ICLK, QCLK, ICLKB and QCLKB during the periods in which the preamble period signals PS_PRE_p/r/d are activated, based on the odd enable signal EN_A and the even enable signal EN_B. The preamble control clocks CLK_PRE_p/r/d may be generated to set the preamble patterns of the data strobe signal DQS during a preamble period. The preamble control clocks CLK_PRE_p/r/d may include the preamble pre-clock CLK_PRE_p (see FIG. 8), the preamble reference clock CLK_PRE_r (see FIG. 8) and the preamble delay clock CLK_PRE_d (see FIG. 8).

The control clock generation circuit 207 may output one of the internal clocks ICLK, QCLK, ICLKB and QCLKB as the preamble reference clock CLK_PRE_r (see FIG. 8) depending on with which one of the first internal clock ICLK and the first inverted internal clock ICLKB the read command RD is synchronized during the period in which the preamble reference period signal PS_PRE_r (see FIG. 4) is activated. In further detail, when the read command RD is synchronized with the first internal clock ICLK and thus the odd enable signal EN_A is activated, the control clock generation circuit 207 may output the first inverted internal clock ICLKB as the preamble reference clock CLK_PRE_r during the period in which the preamble reference period signal PS_PRE_r is activated. When the read command RD is synchronized with the first inverted internal clock ICLKB and thus the even enable signal EN_B is activated, the control clock generation circuit 207 may output the first internal clock ICLK as the preamble reference clock CLK_PRE_r during the period in which the preamble reference period signal PS_PRE_r is activated.

The control clock generation circuit 207 may output one of the internal clocks ICLK, QCLK, ICLKB and QCLKB as the preamble delay clock CLK_PRE_d (see FIG. 8) depending on with which one of the first internal clock ICLK and the first inverted internal clock ICLKB the read command RD is synchronized during the period in which the preamble delay period signal PS_PRE_d (see FIG. 4) is activated. In further detail, when the read command RD is synchronized with the first internal clock ICLK and thus the odd enable signal EN_A is activated, the control clock generation circuit 207 may output the second inverted internal clock QCLKB as the preamble delay clock CLK_PRE_d during the period in which the preamble delay period signal PS_PRE_d is activated. When the read command RD is synchronized with the first inverted internal clock ICLKB and thus the even enable signal EN_B is activated, the control clock generation circuit 207 may output the second internal clock QCLK as the preamble delay clock CLK_PRE_d during the period in which the preamble delay period signal PS_PRE_d is activated.

The control clock generation circuit 207 may output one of the internal clocks ICLK, QCLK, ICLKB and QCLKB as the preamble pre-clock CLK_PRE_p (see FIG. 8) depending on with which one of the first internal clock ICLK and the first inverted internal clock ICLKB the read command RD is synchronized during the period in which the preamble pre-period signal PS_PRE_p (see FIG. 4) is activated. Detailed description for an operation in which the control clock generation circuit 207 generates the preamble pre-clock CLK_PRE_p will be omitted. Accordingly, the control clock generation circuit 207 may change, depending on a generation time point of the read command RD, the paths through which the preamble control clocks CLK_PRE_p/r/d for setting the preamble patterns of the data strobe signal DQS are generated from the internal clocks ICLK, QCLK, ICLKB and QCLKB, thereby reducing an area and power consumed in a circuit for setting preamble patterns.

The control clock generation circuit 207 may generate the toggling control clocks CLK_TOG1_p/r/d and CLK_TOG2_p/r/d from the internal clocks ICLK, QCLK, ICLKB and QCLKB during the periods in which the toggling period signals PS_TOG1_p/r/d and PS_TOG2_p/r/d are activated, based on the odd enable signal EN_A and the even enable signal EN_B. The toggling control clocks CLK_TOG1_p/r/d and CLK_TOG2_p/r/d may include first toggling control clocks CLK_TOG1_p/r/d and second toggling control clocks CLK_TOG2_p/r/d. The first toggling control clocks CLK_TOG1_p/r/d and the second toggling control clocks CLK_TOG2_p/r/d may be generated to toggle the data strobe signal DQS during a toggling period. The first toggling control clocks CLK_TOG1_p/r/d may include a first toggling pre-clock CLK_TOG1_p (see FIG. 8), a first toggling reference clock CLK_TOG1_r (see FIG. 8) and a first toggling delay clock CLK_TOG1_d (see FIG. 8). The second toggling control clocks CLK_TOG2_p/r/d may include a second toggling pre-clock CLK_TOG2_p (see FIG. 8), a second toggling reference clock CLK_TOG2_r (see FIG. 8) and a second toggling delay clock CLK_TOG2_d (see FIG. 8).

The control clock generation circuit 207 may generate the first toggling reference clock CLK_TOG1_r (see FIG. 8) from the first internal clock ICLK. The control clock generation circuit 207 may generate the second toggling reference clock CLK_TOG2_r (see FIG. 8) from the first inverted internal clock ICLKB. The control clock generation circuit 207 may change a generation sequence of the first toggling reference clock CLK_TOG1_r and the second toggling reference clock CLK_TOG2_r depending on with which one of the first internal clock ICLK and the first inverted internal clock ICLKB the read command RD is synchronized. In further detail, when the read command RD is synchronized with the first internal clock ICLK and thus the odd enable signal EN_A is activated, the control clock generation circuit 207 may output the first internal clock ICLK as the first toggling reference clock CLK_TOG1_r during the period in which the first toggling reference period signal PS_TOG1_r (see FIG. 4) is activated. When the read command RD is synchronized with the first internal clock ICLK and thus the odd enable signal EN_A is activated, the control clock generation circuit 207 may output the first inverted internal clock ICLKB as the second toggling reference clock CLK_TOG2_r during the period in which the second toggling reference period signal PS_TOG2_r (see FIG. 4) is activated. When the read command RD is synchronized with the first inverted internal clock ICLKB and thus the even enable signal EN_B is activated, the control clock generation circuit 207 may output the first internal clock ICLK as the first toggling reference clock CLK_TOG1_r during the period in which the second toggling reference period signal PS_TOG2_r is activated. When the read command RD is synchronized with the first inverted internal clock ICLKB and thus the even enable signal EN_B is activated, the control clock generation circuit 207 may output the first inverted internal clock ICLKB as the second toggling reference clock CLK_TOG2_r during the period in which the first toggling reference period signal PS_TOG1_r is activated.

The control clock generation circuit 207 may generate the first toggling delay clock CLK_TOG1_d (see FIG. 8) from the second internal clock QCLK. The control clock generation circuit 207 may generate the second toggling delay clock CLK_TOG2_d (see FIG. 8) from the second inverted internal clock QCLKB. The control clock generation circuit 207 may change a generation sequence of the first toggling delay clock CLK_TOG1_d and the second toggling delay clock CLK_TOG2_d depending on with which one of the first internal clock ICLK and the first inverted internal clock ICLKB the read command RD is synchronized. In further detail, when the read command RD is synchronized with the first internal clock ICLK and thus the odd enable signal EN_A is activated, the control clock generation circuit 207 may output the second internal clock QCLK as the first toggling delay clock CLK_TOG1_d during the period in which the first toggling delay period signal PS_TOG1_d (see FIG. 4) is activated. When the read command RD is synchronized with the first internal clock ICLK and thus the odd enable signal EN_A is activated, the control clock generation circuit 207 may output the second inverted internal clock QCLKB as the second toggling delay clock CLK_TOG2_d during the period in which the second toggling delay period signal PS_TOG2_d (see FIG. 4) is activated. When the read command RD is synchronized with the first inverted internal clock ICLKB and thus the even enable signal EN_B is activated, the control clock generation circuit 207 may output the second internal clock QCLK as the first toggling delay clock CLK_TOG1_d during the period in which the second toggling delay period signal PS_TOG2_d is activated. When the read command RD is synchronized with the first inverted internal clock ICLKB and thus the even enable signal EN_B is activated, the control clock generation circuit 207 may output the second inverted internal clock QCLKB as the second toggling delay clock CLK_TOG2_d during the period in which the first toggling delay period signal PS_TOG1_d is activated.

The control clock generation circuit 207 may generate the first toggling pre-clock CLK_TOG1_p (see FIG. 8) from the second inverted internal clock QCLKB. The control clock generation circuit 207 may generate the second toggling pre-clock CLK_TOG2_p (see FIG. 8) from the second internal clock QCLK. The control clock generation circuit 207 may change a generation sequence of the first toggling pre-clock CLK_TOG1_p and the second toggling pre-clock CLK_TOG2_p depending on with which one of the first internal clock ICLK and the first inverted internal clock ICLKB the read command RD is synchronized. Detailed description for an operation in which the control clock generation circuit 207 generates the first toggling pre-clock CLK_TOG1_p and the second toggling pre-clock CLK_TOG2_p will be omitted. Accordingly, the control clock generation circuit 207 may maintain, regardless of a generation time point of the read command RD, the paths through which the toggling control clocks CLK_TOG1_p/r/d and CLK_TOG2_p/r/d for toggling the data strobe signal DQS are generated from the internal clocks ICLK, QCLK, ICLKB and QCLKB, thereby preventing degradation in the characteristics of the data strobe signal DQS generated when the paths through which the toggling control clocks CLK_TOG1_p/r/d and CLK_TOG2_p/r/d are generated are changed depending on a generation time point of the read command RD.

The control clock generation circuit 207 may generate the postamble control clocks CLK_PST_p/r/d from the internal clocks ICLK, QCLK, ICLKB and QCLKB during the periods in which the postamble period signals PS_PST_p/r/d are activated, based on the odd enable signal EN_A and the even enable signal EN_B. The postamble control clocks CLK_PST_p/r/d may be generated to set the postamble patterns of the data strobe signal DQS during a postamble period. The postamble control clocks CLK_PST_p/r/d may include the postamble pre-clock CLK_PST_p (see FIG. 8), the postamble reference clock CLK_PST_r (see FIG. 8) and the postamble delay clock CLK_PST_d (see FIG. 8).

The control clock generation circuit 207 may output one of the internal clocks ICLK, QCLK, ICLKB and QCLKB as the postamble reference clock CLK_PST_r (see FIG. 8) depending on with which one of the first internal clock ICLK and the first inverted internal clock ICLKB the read command RD is synchronized during the period in which the postamble reference period signal PS_PST_r (see FIG. 4) is activated. In further detail, when the read command RD is synchronized with the first internal clock ICLK and thus the odd enable signal EN_A is activated, the control clock generation circuit 207 may output the first internal clock ICLK as the postamble reference clock CLK_PST_r during the period in which the postamble reference period signal PS_PST_r is activated. When the read command RD is synchronized with the first inverted internal clock ICLKB and thus the even enable signal EN_B is activated, the control clock generation circuit 207 may output the first inverted internal clock ICLKB as the postamble reference clock CLK_PST_r during the period in which the postamble reference period signal PS_PST_r is activated.

The control clock generation circuit 207 may output one of the internal clocks ICLK, QCLK, ICLKB and QCLKB as the postamble delay clock CLK_PST_d (see FIG. 8) depending on with which one of the first internal clock ICLK and the first inverted internal clock ICLKB the read command RD is synchronized during the period in which the postamble delay period signal PS_PST_d (see FIG. 4) is activated. In further detail, when the read command RD is synchronized with the first internal clock ICLK and thus the odd enable signal EN_A is activated, the control clock generation circuit 207 may output the second internal clock QCLK as the postamble delay clock CLK_PST_d during the period in which the postamble delay period signal PS_PST_d is activated. When the read command RD is synchronized with the first inverted internal clock ICLKB and thus the even enable signal EN_B is activated, the control clock generation circuit 207 may output the second inverted internal clock QCLKB as the postamble delay clock CLK_PST_d during the period in which the postamble delay period signal PS_PST_d is activated.

The control clock generation circuit 207 may output one of the internal clocks ICLK, QCLK, ICLKB and QCLKB as the postamble pre-clock CLK_PST_p (see FIG. 8) depending on with which one of the first internal clock ICLK and the first inverted internal clock ICLKB the read command RD is synchronized during the period in which the postamble pre-period signal PS_PST_p (see FIG. 4) is activated. Detailed description for an operation in which the control clock generation circuit 207 generates the postamble pre-clock CLK_PST_p (see FIG. 8) will be omitted. Accordingly, the control clock generation circuit 207 may change, depending on a generation time point of the read command RD, the paths through which the postamble control clocks CLK_PST_p/r/d for setting the postamble patterns of the data strobe signal DQS are generated from the internal clocks ICLK, QCLK, ICLKB and QCLKB, thereby reducing an area and power consumed in a circuit for setting postamble patterns.

The strobe signal generation circuit 209 may generate the data strobe signal DQS whose level transitions in synchronization with the preamble control clocks CLK_PRE_p/r/d, the toggling control clocks CLK_TOG1_*p/r/d* and CLK_TOG2_*p/r/d* and the postamble control clocks CLK_PST_p/r/d. The strobe signal generation circuit 209 may generate the data strobe signal DQS whose level transitions during the preamble period in synchronization with the preamble control clocks CLK_PRE_p/r/d. The strobe signal generation circuit 209 may set a level of the data strobe signal DQS to a first logic level in synchronization with the preamble reference clock CLK_PRE_r. The strobe signal generation circuit 209 may set a level of the data strobe signal DQS to a second logic level in synchronization with the preamble delay clock CLK_PRE_d. The first logic level may be set to a logic high level, and the second logic level may be set to a logic low level. The strobe signal generation circuit 209 may generate the data strobe signal DQS whose level transitions during the toggling period in synchronization with the toggling control clocks CLK_TOG1_*p/r/d* and CLK_TOG2_*p/r/d*. The strobe signal generation circuit 209 may set a level of the data strobe signal DQS to the first logic level in synchronization with the first and second toggling reference clocks CLK_TOG1_*r* and CLK_TOG2_*r*. The strobe signal generation circuit 209 may set a level of the data strobe signal DQS to the second logic level in synchronization with the first and second toggling delay clocks CLK_TOG1_*d* and CLK_TOG2_*d*. The strobe signal generation circuit 209 may generate the data strobe signal DQS whose level transitions during the postamble period in synchronization with the postamble control clocks CLK_PST_p/r/d. The strobe signal generation circuit 209 may set a level of the data strobe signal DQS to the first logic level in synchronization with the postamble reference clock CLK_PST_r. The strobe signal generation circuit 209 may set a level of the data strobe signal DQS to the second logic level in synchronization with the postamble delay clock CLK_PST_d. The detailed configuration and operation of the strobe signal generation circuit 209 will be described later with reference to FIG. 9.

The data output circuit 211 may output the data DQ by serializing the read data RD_DATA in synchronization with the toggling control clocks CLK_TOG1_*p/r/d* and CLK_TOG2_*p/r/d*. The data output circuit 211 may output a first bit RD_DATA<1> of the read data RD_DATA as the data DQ in synchronization with the first toggling reference clock CLK_TOG1_*r*. The data output circuit 211 may output a second bit RD_DATA<2> of the read data RD_DATA as the data DQ in synchronization with the first toggling delay clock CLK_TOG1_*d*. The data output circuit 211 may output a third bit RD_DATA<3> of the read data RD_DATA as the data DQ in synchronization with the second toggling reference clock CLK_TOG2_*r*. The data output circuit 211 may output a fourth bit RD_DATA<4> of the read data RD_DATA as the data DQ in synchronization with the second toggling delay clock CLK_TOG2_*d*. The detailed configuration and operation of the data output circuit 211 will be described later with reference to FIG. 10.

Figure 3:
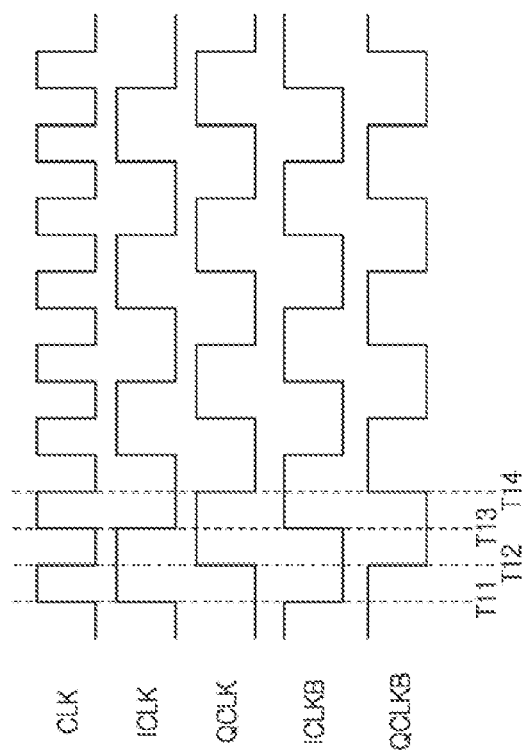
FIG. 3 is a timing diagram to assist in the description of the operation of an internal clock generation circuit illustrated in FIG. 2.

FIG. 3 is a timing diagram to assist in the description of the operation of the internal clock generation circuit 201 illustrated in FIG. 2. Referring to FIG. 3, the internal clock generation circuit 201 may generate the first internal clock ICLK which is toggled to a logic high level in synchronization with a rising edge T11 of the clock CLK and is toggled to a logic low level in synchronization with a rising edge T13 of the clock CLK. The internal clock generation circuit 201 may generate the second internal clock QCLK which is toggled to a logic high level in synchronization with a falling edge T12 of the clock CLK and is toggled to a logic low level in synchronization with a falling edge T14 of the clock CLK. The internal clock generation circuit 201 may generate the first inverted internal clock ICLKB which is toggled to a logic low level in synchronization with the rising edge T11 of the clock CLK and is toggled to a logic high level in synchronization with the rising edge T13 of the clock CLK. The internal clock generation circuit 201 may generate the second inverted internal clock QCLKB which is toggled to a logic low level in synchronization with the falling edge T12 of the clock CLK and is toggled to a logic high level in synchronization with the falling edge T14 of the clock CLK.

Figure 4:
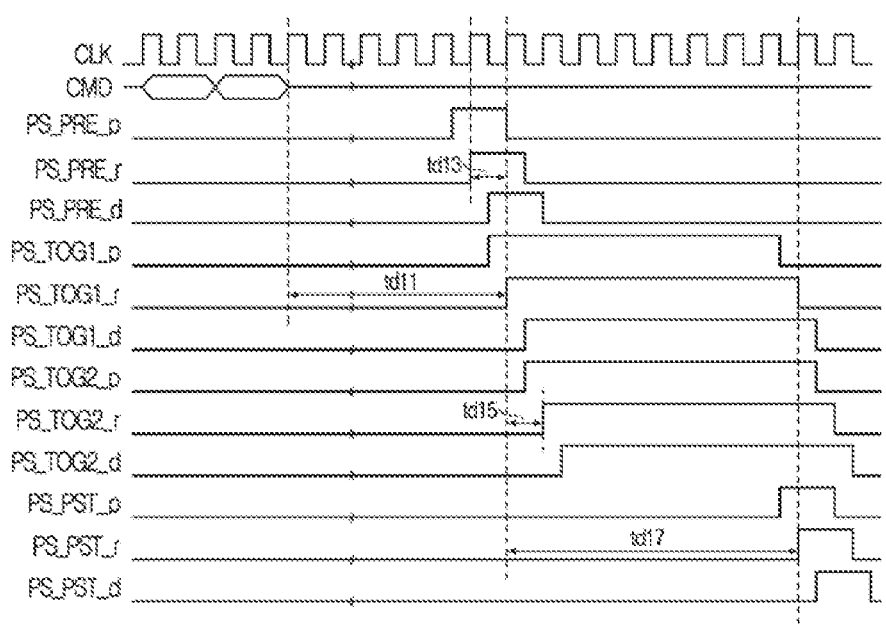
FIG. 4 is a timing diagram to assist in the description of the operation of a period signal generation circuit illustrated in FIG. 2.

FIG. 4 is a timing diagram to assist in the description of the operation of the period signal generation circuit 205 illustrated in FIG. 2. Referring to FIG. 4, the period signal generation circuit 205 may activate the preamble reference period signal PS_PRE_r in a first preset period td13 before an ending time point of a read latency period td11. The period signal generation circuit 205 may activate the preamble pre-period signal PS_PRE_p earlier by a half cycle of the clock CLK than the preamble reference period signal PS_PRE_r. The period signal generation circuit 205 may activate the preamble delay period signal PS_PRE_d later by a half cycle of the clock CLK than the preamble reference period signal PS_PRE_r.

The period signal generation circuit 205 may activate the first toggling reference period signal PS_TOG1_*r* at the ending time point of the read latency period td11. The period signal generation circuit 205 may activate the first toggling pre-period signal PS_TOG1_*p* earlier by a half cycle of the clock CLK than the first toggling reference period signal PS_TOG1_*r*. The period signal generation circuit 205 may activate the first toggling delay period signal PS_TOG1_*d* later by a half cycle of the clock CLK than the first toggling reference period signal PS_TOG1_*r*.

The period signal generation circuit 205 may activate the second toggling reference period signal PS_TOG2_*r* in synchronization with the clock CLK in a second preset period td15 after the ending time point of the read latency period td11. The period signal generation circuit 205 may activate the second toggling pre-period signal PS_TOG2_*p* earlier by a half cycle of the clock CLK than the second toggling reference period signal PS_TOG2_*r*. The period signal generation circuit 205 may activate the second toggling delay period signal PS_TOG2_*d* later by a half cycle of the clock CLK than the second toggling reference period signal PS_TOG2_*r*.

The period signal generation circuit 205 may activate the postamble reference period signal PS_PST_r in synchronization with the clock CLK in a third preset period td17 after the ending time point of the read latency period td11. The period signal generation circuit 205 may activate the postamble pre-period signal PS_PST_p earlier by a half cycle of the clock CLK than the postamble reference period signal PS_PST_r. The period signal generation circuit 205 may activate the postamble delay period signal PS_PST_d later by a half cycle of the clock CLK than the postamble reference period signal PS_PST_r.

Figure 5:
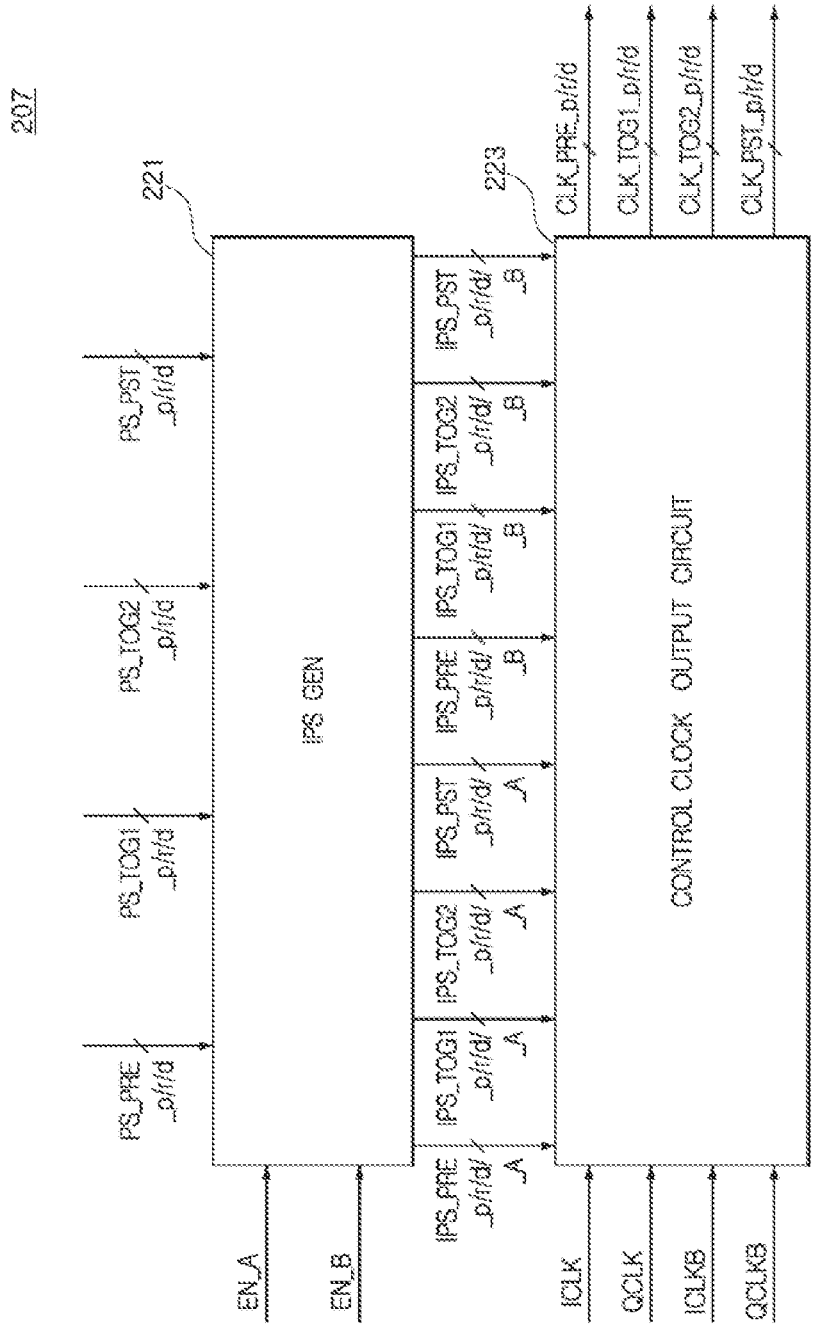
FIG. 5 is a block diagram illustrating a configuration of an embodiment of a control clock generation circuit illustrated in FIG. 2.

FIG. 5 is a block diagram illustrating a configuration of an embodiment of the control clock generation circuit 207 illustrated in FIG. 2. As illustrated in FIG. 5, the control clock generation circuit 207 may include an internal period signal generation circuit (IPS GEN) 221 and a control clock output circuit (CONTROL CLOCK OUTPUT CIRCUIT) 223.

The internal period signal generation circuit 221 may output the preamble period signals PS_PRE_p/r/d as preamble odd period signals IPS_PRE_p/r/d_A, respectively, when the odd enable signal EN_A is activated. The preamble odd period signals IPS_PRE_p/r/d_A may include a preamble odd pre-period signal IPS_PRE_p_A (see FIG. 6), a preamble odd reference period signal IPS_PRE_r_A (see FIG. 6) and a preamble odd delay period signal IPS_PRE_d_A (see FIG. 6). The internal period signal generation circuit 221 may output the preamble period signals PS_PRE_p/r/d as preamble even period signals IPS_PRE_p/r/d_B, respectively, when the even enable signal EN_B is activated. The preamble even period signals IPS_PRE_p/r/d_B may include a preamble even pre-period signal IPS_PRE_p_B (see FIG. 7), a preamble even reference period signal IPS_PRE_r_B (see FIG. 7) and a preamble even delay period signal IPS_PRE_d_B (see FIG. 7).

The internal period signal generation circuit 221 may output the first toggling period signals PS_TOG1_p/r/d as first toggling odd period signals IPS_TOG1_p/r/d_A, respectively, when the odd enable signal EN_A is activated. The first toggling odd period signals IPS_TOG1_p/r/d_A may include a first toggling odd pre-period signal IPS_TOG1_p_A (see FIG. 6), a first toggling odd reference period signal IPS_TOG1_r_A (see FIG. 6) and a first toggling odd delay period signal IPS_TOG1_d_A (see FIG. 6). The internal period signal generation circuit 221 may output the second toggling period signals PS_TOG2_p/r/d as second toggling odd period signals IPS_TOG2_p/r/d_A, respectively, when the odd enable signal EN_A is activated. The second toggling odd period signals IPS_TOG2_p/r/d_A may include a second toggling odd pre-period signal IPS_TOG2_p_A (see FIG. 6), a second toggling odd reference period signal IPS_TOG2_r_A (see FIG. 6) and a second toggling odd delay period signal IPS_TOG2_d_A (see FIG. 6).

The internal period signal generation circuit 221 may output the first toggling period signals PS_TOG1_p/r/d as second toggling even period signals IPS_TOG2_p/r/d_B, respectively, when the even enable signal EN_B is activated. The second toggling even period signals IPS_TOG2_p/r/d_B may include a second toggling even pre-period signal IPS_TOG2_p_B (see FIG. 7), a second toggling even reference period signal IPS_TOG2_r_B (see FIG. 7) and a second toggling even delay period signal IPS_TOG2_d_B (see FIG. 7). The internal period signal generation circuit 221 may output the second toggling period signals PS_TOG2_p/r/d as first toggling even period signals IPS_TOG1_p/r/d_B, respectively, when the even enable signal EN_B is activated. The first toggling even period signals IPS_TOG1_p/r/d_B may include a first toggling even pre-period signal IPS_TOG1_p_B (see FIG. 7), a first toggling even reference period signal IPS_TOG1_r_B (see FIG. 7) and a first toggling even delay period signal IPS_TOG1_d_B (see FIG. 7).

The internal period signal generation circuit 221 may output the postamble period signals PS_PST_p/r/d as postamble odd period signals IPS_PST_p/r/d_A, respectively, when the odd enable signal EN_A is activated. The postamble odd period signals IPS_PST_p/r/d_A may include a postamble odd pre-period signal IPS_PST_p_A (see FIG. 6), a postamble odd reference period signal IPS_PST_r_A (see FIG. 6) and a postamble odd delay period signal IPS_PST_d_A (see FIG. 6). The internal period signal generation circuit 221 may output the postamble period signals PS_PST_p/r/d as postamble even period signals IPS_PST_p/r/d_B, respectively, when the even enable signal EN_B is activated. The postamble even period signals IPS_PST_p/r/d_B may include a postamble even pre-period signal IPS_PST_p_B (see FIG. 7), a postamble even reference period signal IPS_PST_r_B (see FIG. 7) and a postamble even delay period signal IPS_PST_d_B (see FIG. 7). The more detailed operation of the internal period signal generation circuit 221 will be described later with reference to FIGS. 6 and 7.

The control clock output circuit 223 may output the preamble control clocks CLK_PRE_p/r/d from the internal clocks ICLK, QCLK, ICLKB and QCLKB, based on the preamble odd period signals IPS_PRE_p/r/d_A and the preamble even period signals IPS_PRE_p/r/d_B. The control clock output circuit 223 may output the first toggling control clocks CLK_TOG1_p/r/d from the internal clocks ICLK, QCLK, ICLKB and QCLKB, based on the first toggling odd period signals IPS_TOG1_p/r/d_A and the first toggling even period signals IPS_TOG1_p/r/d_B. The control clock output circuit 223 may output the second toggling control clocks CLK_TOG2_p/r/d from the internal clocks ICLK, QCLK, ICLKB and QCLKB, based on the second toggling odd period signals IPS_TOG2_p/r/d_A and the second toggling even period signals IPS_TOG2_p/r/d_B. The control clock output circuit 223 may output the postamble control clocks CLK_PST_p/r/d from the internal clocks ICLK, QCLK, ICLKB and QCLKB, based on the postamble odd period signals IPS_PST_p/r/d_A and the postamble even period signals IPS_PST_p/r/d_B. The more detailed configuration and operation of the control clock output circuit 223 will be described later with reference to FIG. 8.

Figure 6:
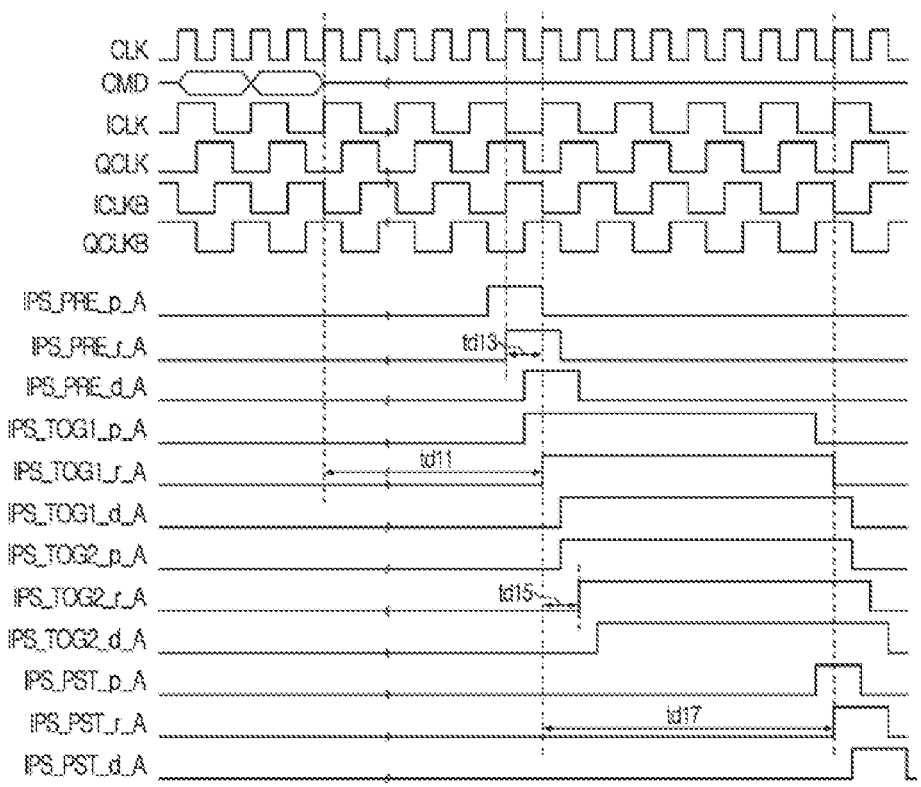
FIGS. 6 and 7 are timing diagrams to assist in the description of the operation of an internal period signal generation circuit illustrated in FIG. 5.
Figure 7:
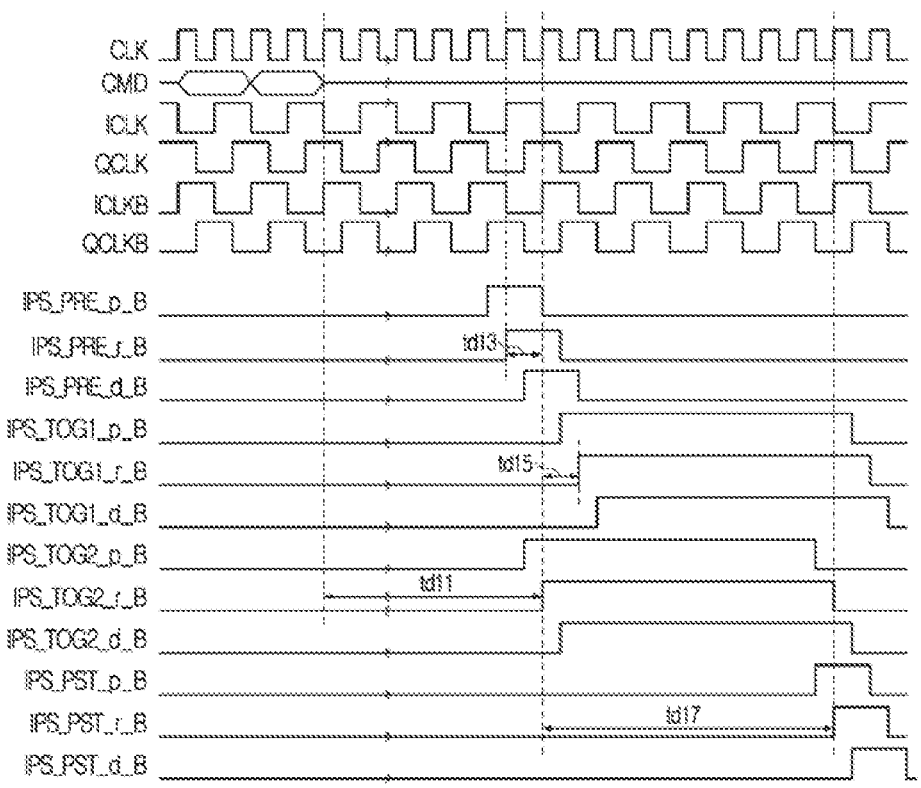

FIGS. 6 and 7 are timing diagrams to assist in the description of the operation of the internal period signal generation circuit 221 depending on a generation time point of the read command RD. FIG. 6 corresponds to a state in which the command CMD (see FIG. 1) for performing the read operation is inputted to the apparatus 120 in synchronization with the first internal clock ICLK. FIG. 7 corresponds to a state in which the command CMD for performing the read operation is inputted to the apparatus 120 in synchronization with the first inverted internal clock ICLKB.

In the case of FIG. 6, the internal period signal generation circuit 221 may output the preamble pre-period signal PS_PRE_p, the preamble reference period signal PS_PRE_r and the preamble delay period signal PS_PRE_d as the preamble odd pre-period signal IPS_PRE_p_A, the preamble odd reference period signal IPS_PRE_r_A and the preamble odd delay period signal IPS_PRE_d_A, respectively. In the case of FIG. 7, the internal period signal generation circuit 221 may output the preamble pre-period signal PS_PRE_p, the preamble reference period signal PS_PRE_r and the preamble delay period signal PS_PRE_d as the preamble even pre-period signal IPS_PRE_p_B, the preamble even reference period signal IPS_PRE_r_B and the preamble even delay period signal IPS_PRE_d_B, respectively.

In the case of FIG. 6, the internal period signal generation circuit 221 may output the first toggling pre-period signal PS_TOG1_p, the first toggling reference period signal PS_TOG1_r and the first toggling delay period signal PS_TOG1_d as the first toggling odd pre-period signal IPS_TOG1_p_A, the first toggling odd reference period signal IPS_TOG1_r_A and the first toggling odd delay period signal IPS_TOG1_d_A, respectively. In the case of FIG. 7, the internal period signal generation circuit 221 may output the first toggling pre-period signal PS_TOG1_p, the first toggling reference period signal PS_TOG1_r and the first toggling delay period signal PS_TOG1_d as the second toggling even pre-period signal IPS_TOG2_p_B, the second toggling even reference period signal IPS_TOG2_r_B and the second toggling even delay period signal IPS_TOG2_d_B, respectively.

In the case of FIG. 6, the internal period signal generation circuit 221 may output the second toggling pre-period signal PS_TOG2_p, the second toggling reference period signal PS_TOG2_r and the second toggling delay period signal PS_TOG2_d as the second toggling odd pre-period signal IPS_TOG2_p_A, the second toggling odd reference period signal IPS_TOG2_r_A and the second toggling odd delay period signal IPS_TOG2_d_A, respectively. In the case of FIG. 7, the internal period signal generation circuit 221 may output the second toggling pre-period signal PS_TOG2_p, the second toggling reference period signal PS_TOG2_r and the second toggling delay period signal PS_TOG2_d as the first toggling even pre-period signal IPS_TOG1_p_B, the first toggling even reference period signal IPS_TOG1_r_B and the first toggling even delay period signal IPS_TOG1_d_B, respectively.

In the case of FIG. 6, the internal period signal generation circuit 221 may output the postamble pre-period signal PS_PST_p, the postamble reference period signal PS_PST_r and the postamble delay period signal PS_PST_d as the postamble odd pre-period signal IPS_PST_p_A, the postamble odd reference period signal IPS_PST_r_A and the postamble odd delay period signal IPS_PST_d_A, respectively. In the case of FIG. 7, the internal period signal generation circuit 221 may output the postamble pre-period signal PS_PST_p, the postamble reference period signal PS_PST_r and the postamble delay period signal PS_PST_d as the postamble even pre-period signal IPS_PST_p_B, the postamble even reference period signal IPS_PST_r_B and the postamble even delay period signal IPS_PST_d_B, respectively.

Figure 8:
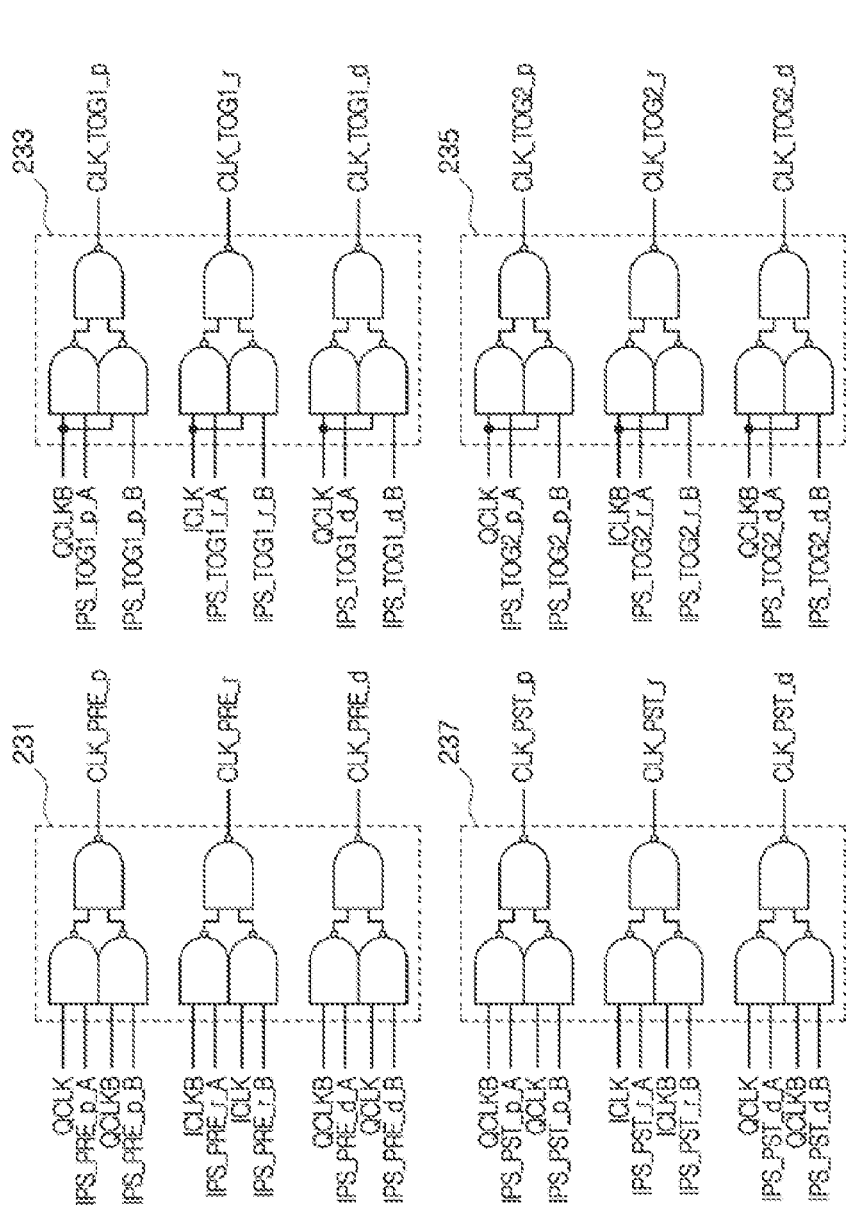
FIG. 8 is a circuit diagram illustrating a configuration of an embodiment of a control clock output circuit illustrated in FIG. 5.

FIG. 8 is a circuit diagram illustrating a configuration of an embodiment of the control clock output circuit 223 illustrated in FIG. 5. As illustrated in FIG. 8, the control clock output circuit 223 may include a preamble control clock output circuit 231, a first toggling control clock output circuit 233, a second toggling control clock output circuit 235 and a postamble control clock output circuit 237.

The preamble control clock output circuit 231 may output the first inverted internal clock ICLKB as the preamble reference clock CLK_PRE_r during a period in which the preamble odd reference period signal IPS_PRE_r_A is activated. The preamble control clock output circuit 231 may output the first internal clock ICLK as the preamble reference clock CLK_PRE_r during a period in which the preamble even reference period signal IPS_PRE_r_B is activated. Description for an operation in which the preamble control clock output circuit 231 generates the preamble pre-clock CLK_PRE_p and the preamble delay clock CLK_PRE_d will be omitted.

The first toggling control clock output circuit 233 may output the first internal clock ICLK as the first toggling reference clock CLK_TOG1_r during a period in which any one of the first toggling odd reference period signal IPS_TOG1_r_A and the first toggling even reference period signal IPS_TOG1_r_B is activated. Description for an operation in which the first toggling control clock output circuit 233 generates the first toggling pre-clock CLK_TOG1_p and the first toggling delay clock CLK_TOG1_d will be omitted.

The second toggling control clock output circuit 235 may output the first inverted internal clock ICLKB as the second toggling reference clock CLK_TOG2_r during a period in which any one of the second toggling odd reference period signal IPS_TOG2_r_A and the second toggling even reference period signal IPS_TOG2_r_B is activated. Description for an operation in which the second toggling control clock output circuit 235 generates the second toggling pre-clock CLK_TOG2_p and the second toggling delay clock CLK_TOG2_d will be omitted.

The postamble control clock output circuit 237 may output the first internal clock ICLK as the postamble reference clock CLK_PST_r during a period in which the postamble odd reference period signal IPS_PST_r_A is activated. The postamble control clock output circuit 231 may output the first inverted internal clock ICLKB as the postamble reference clock CLK_PST_r during a period in which the postamble even reference period signal IPS_PST_r_B is activated. Description for an operation in which the postamble control clock output circuit 237 generates the postamble pre-clock CLK_PST_p and the postamble delay clock CLK_PST_d will be omitted.

Figure 9:
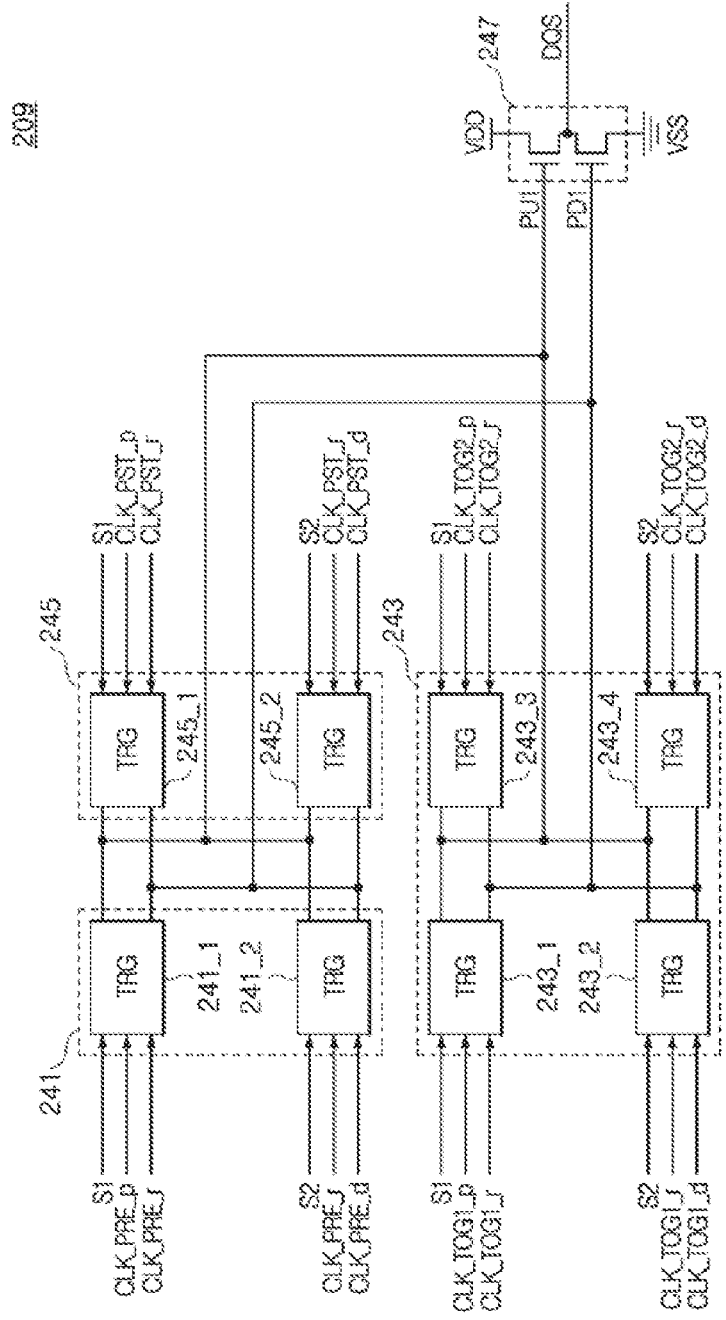
FIG. 9 is a diagram illustrating an embodiment of a strobe signal generation circuit illustrated in FIG. 2.

FIG. 9 is a diagram illustrating an embodiment of the strobe signal generation circuit 209 illustrated in FIG. 2. As illustrated in FIG. 9, the strobe signal generation circuit 209 may include a preamble driving control circuit 241, a toggling driving control circuit 243, a postamble driving control circuit 245 and a strobe signal driving circuit 247.

The preamble driving control circuit 241 may include trigger circuits (TRG) 2411 and 241_2. The preamble driving control circuit 241 may generate a first pull-up signal PU1 and a first pull-down signal PD1 during the preamble period in synchronization with the preamble control clocks CLK_PRE_p, CLK_PRE_r and CLK_PRE_d, based on a first input signal S1 and a second input signal S2. The first input signal S1 may have a logic high level when the read operation is performed. The second input signal S2 may have a logic low level when the read operation is performed. The first pull-down signal PD1 may be generated by inverting a logic level of the first pull-up signal PU1. The trigger circuit 241_1 may latch the first input signal S1 at an internal node of the trigger circuit 241_1 in synchronization with the rising edge of the preamble reference clock CLK_PRE_r, and may output the latched first input signal S1 as the first pull-up signal PU1. The trigger circuit 241_1 may precharge the internal node of the trigger circuit 241_1 at the falling edge of the preamble pre-clock CLK_PRE_p. The trigger circuit 241_2 may latch the second input signal S2 at an internal node of the trigger circuit 241_2 in synchronization with the rising edge of the preamble delay clock CLK_PRE_d, and may output the latched second input signal S2 as the first pull-up signal PU1. The trigger circuit 241_2 may precharge the internal node of the trigger circuit 241_2 at the falling edge of the preamble reference clock CLK_PRE_r.

The toggling driving control circuit 243 may include trigger circuits (TRG) 243_1, 243_2, 243_3 and 243_4. The toggling driving control circuit 243 may generate the first pull-up signal PU1 and the first pull-down signal PD1 during the toggling period in synchronization with the first toggling control clocks CLK_TOG1_p, CLK_TOG1_r and CLK_TOG1_d and the second toggling control clocks CLK_TOG2_p, CLK_TOG2_r and CLK_TOG2_d, based on the first input signal S1 and the second input signal S2.

Description for detailed operations of the trigger circuits 243_1, 243_2, 2433 and 243_4 will be omitted.

The postamble driving control circuit 245 may include trigger circuits (TRG) 2451 and 245_2. The postamble driving control circuit 245 may generate the first pull-up signal PU1 and the first pull-down signal PD1 during the postamble period in synchronization with the postamble control clocks CLK_PST_p, CLK_PST_r and CLK_PST_d, based on the first input signal S1 and the second input signal S2. Description for detailed operations of the trigger circuits 245_1 and 245_2 will be omitted.

The strobe signal driving circuit 247 may pull-up drive the data strobe signal DQS to a power voltage VDD when the first pull-up signal PU1 has a logic high level. The strobe signal driving circuit 247 may pull-down drive the data strobe signal DQS to a ground voltage VSS when the first pull-down signal PD1 has a logic high level.

Figure 10:
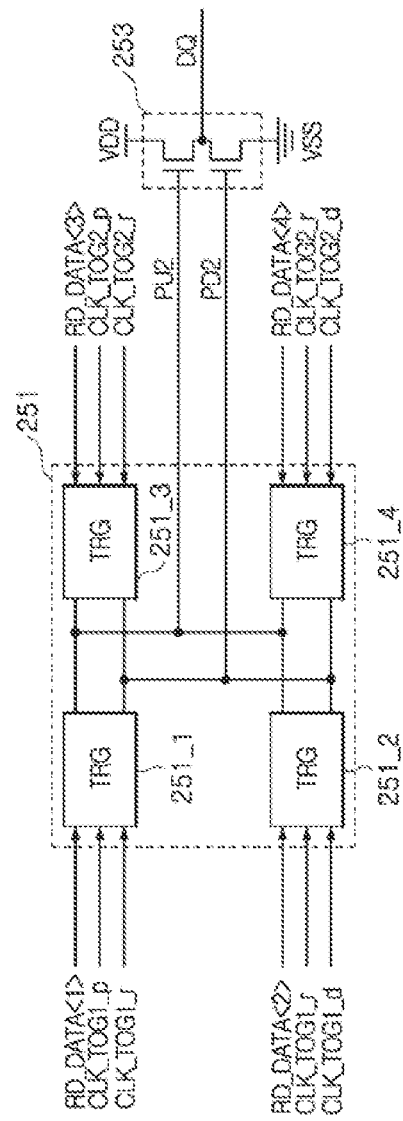
FIG. 10 is a diagram illustrating an embodiment of a data output circuit illustrated in FIG. 2.

FIG. 10 is a diagram illustrating an embodiment of the data output circuit 211 illustrated in FIG. 2. As illustrated in FIG. 10, the data output circuit 211 may include a data output driving control circuit 251 and a data output driving circuit 253.

The data output driving control circuit 251 may include trigger circuits (TRG) 251_1, 251_2, 251_3 and 251_4. The data output driving control circuit 251 may generate a second pull-up signal PU2 and a second pull-down signal PD2 in synchronization with the first toggling control clocks CLK_TOG1_p, CLK_TOG1_r and CLK_TOG1_d and the second toggling control clocks CLK_TOG2_p, CLK_TOG2_r and CLK_TOG2_d, based on the first, second, third and fourth bits RD_DATA<1:4> of the read data RD_DATA. The second pull-down signal PD2 may be generated by inverting a logic level of the second pull-up signal PU2. The trigger circuit 251_1 may latch the first bit RD_DATA<1> of the read data RD_DATA at an internal node of the trigger circuit 251_1 in synchronization with the rising edge of the first toggling reference clock CLK_TOG1_r, and may output the latched first bit RD_DATA<1> of the read data RD_DATA as the second pull-up signal PU2. The trigger circuit 251_1 may precharge the internal node of the trigger circuit 251_1 at the falling edge of the first toggling pre-clock CLK_TOG1_p. The trigger circuit 2512 may latch the second bit RD_DATA<2> of the read data RD_DATA at an internal node of the trigger circuit 251_2 in synchronization with the rising edge of the first toggling delay clock CLK_TOG1_d, and may output the latched second bit RD_DATA<2> of the read data RD_DATA as the second pull-up signal PU2. The trigger circuit 251_2 may precharge the internal node of the trigger circuit 251_2 at the falling edge of the first toggling reference clock CLK_TOG1_r. Description for detailed operations of the trigger circuits 251_3 and 251_4 will be omitted.

The data output driving circuit 253 may pull-up drive the data DQ to the power voltage VDD when the second pull-up signal PU2 has a logic high level. The data output driving circuit 253 may pull-down drive the data DQ to the ground voltage VSS when the second pull-down signal PD2 has a logic high level.

Figure 11:
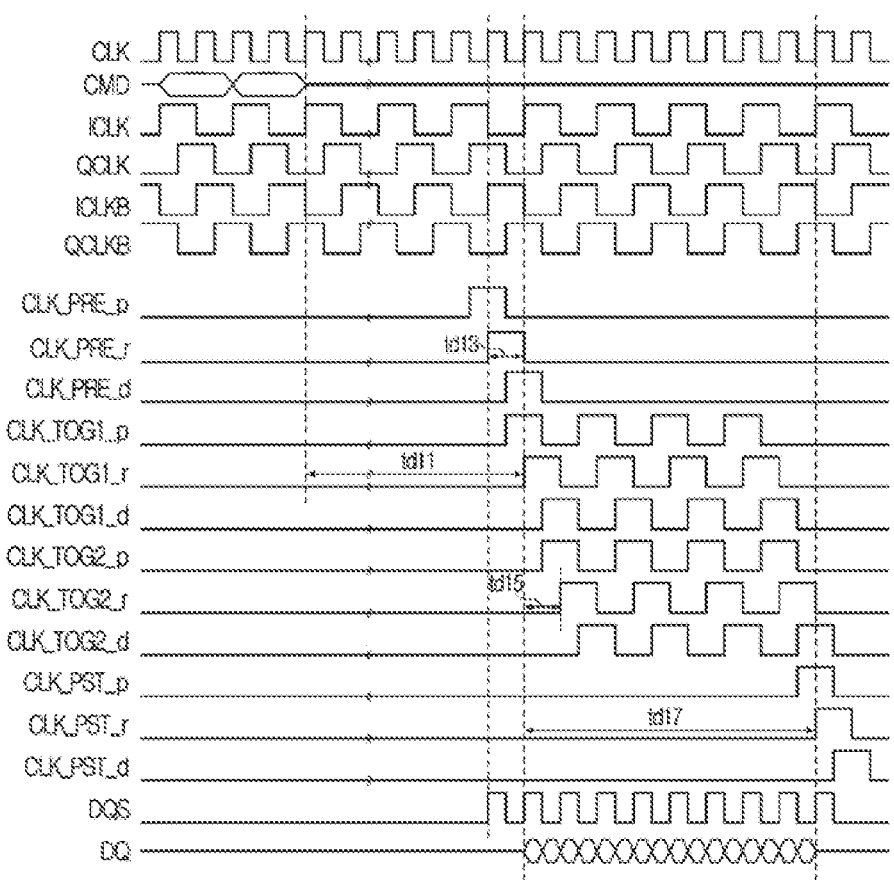
FIGS. 11 and 12 are timing diagrams to assist in the description of a read operation performed in the apparatus illustrated in FIG. 2.
Figure 12:
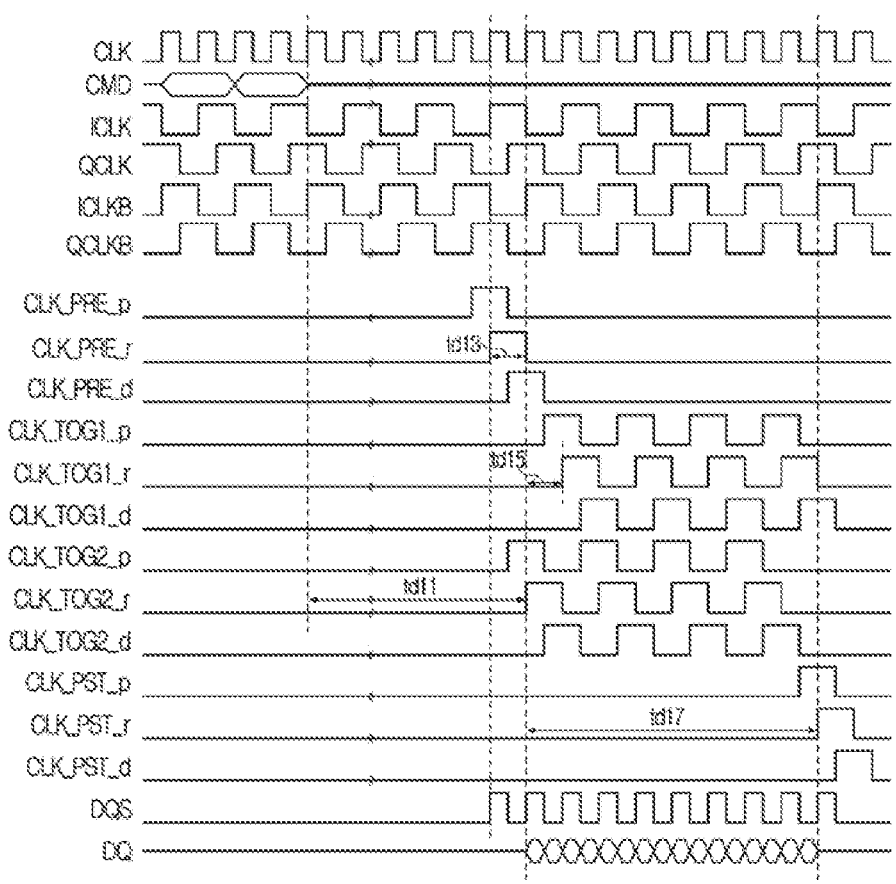

FIGS. 11 and 12 are timing diagrams to assist in the description of the read operation performed depending on a generation time point of the read command RD in the apparatus 120 illustrated in FIG. 2. FIG. 11 corresponds to a state in which the command CMD (see FIG. 1) for performing the read operation is inputted to the apparatus 120 in synchronization with the first internal clock ICLK. FIG. 12 corresponds to a state in which the command CMD for performing the read operation is inputted to the apparatus 120 in synchronization with the first inverted internal clock ICLKB.

Referring to FIGS. 11 and 12, it may be seen that the respective preamble control clocks CLK_PRE_p, CLK_PRE_r and CLK_PRE_d are generated from the different internal clocks ICLK, QCLK, ICLKB and QCLKB depending on a generation time point of the read command RD. Also, it may be seen that the respective postamble control clocks CLK_PST_p, CLK_PST_r and CLK_PST_d are generated from the different internal clocks ICLK, QCLK, ICLKB and QCLKB depending on a generation time point of the read command RD.

On the other hand, it may be seen that each of the toggling control clocks CLK_TOG1_p, CLK_TOG1_r, CLK_TOG1_d, CLK_TOG2_p, CLK_TOG2_r and CLK_TOG2_d is generated from one of the internal clocks ICLK, QCLK, ICLKB and QCLKB regardless of a generation time point of the read command RD. By changing a generation sequence of the first toggling control clocks CLK_TOG1_p/r/d and the second toggling control clocks CLK_TOG2_p/r/d depending on a generation time point of the read command RD, the apparatus 120 may stably toggle the data strobe signal DQS regardless of the generation time point of the read command RD.

As is apparent from the above description, according to the present disclosure, when performing a read operation, by changing, depending on a generation time point of a read command, a path through which a preamble (postamble) control clock for setting a preamble (postamble) pattern of a data strobe signal is generated from an internal clock, it is possible to reduce an area and power consumed in a circuit for setting the preamble (postamble) pattern.

In addition, according to the present disclosure, when performing a read operation, by maintaining, regardless of a generation time point of the read command, a path through which a toggling control clock for toggling the data strobe signal is generated from the internal clock, it is possible to prevent degradation in the characteristics of the data strobe signal generated when the path through which the toggling control clock is generated is changed depending on a generation time point of the read command.

Figure 13:
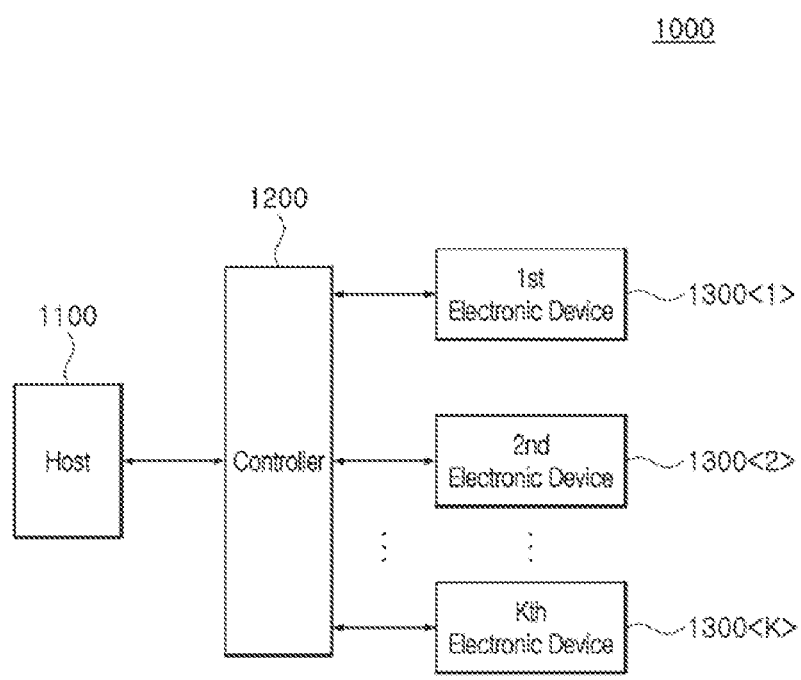
FIG. 13 is a block diagram illustrating a configuration of another embodiment of the system illustrated in FIG. 1.

FIG. 13 is a block diagram illustrating a configuration of another embodiment of the system 100 illustrated in FIG. 1. As illustrated in FIG. 13, a system 1000 may include a host 1100, a controller 1200 and electronic devices 1300<1:K>. The controller 1200 may be implemented by the controller 110 illustrated in FIG. 1. Each of the electronic devices 1300<1:K> may be implemented by the apparatus 120 illustrated in FIG. 1.

The host 1100 and the controller 1200 may transmit signals to each other by using an interface protocol. Examples of the interface protocol used between the host 1100 and the controller 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI) and USB (universal serial bus).

The controller 1200 may control the electronic devices 1300<1:K> so that each of the electronic devices 1300<1:K> performs various internal operations including a read operation.

According to an embodiment, the electronic devices 1300<1:K> may be implemented using DRAM (dynamic random access memory), PRAM (phase change random access memory), RRAM (resistive random access memory), MRAM (magnetic random access memory) and/or FRAM (ferroelectric random access memory).

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. An apparatus comprising:
a control clock generation circuit configured to generate a first toggling reference clock from a first internal clock and generate a second toggling reference clock from a first inverted internal clock, when a read operation is performed; and
a strobe signal generation circuit configured to generate a data strobe signal whose level transitions during a toggling period in synchronization with the first and second toggling reference clocks, wherein a generation sequence of the first and second toggling reference clocks is changed depending on with which one of the first internal clock and the first inverted internal clock a read command for the read operation is synchronized.

2. The apparatus according to claim 1, wherein the control clock generation circuit is configured to, when the read command is synchronized with the first internal clock:
output the first internal clock as the first toggling reference clock during a period in which a first toggling reference period signal is activated; and
output the first inverted internal clock as the second toggling reference clock during a period in which a second toggling reference period signal is activated, wherein the first and second toggling reference period signals are sequentially activated when the read operation is performed.

3. The apparatus according to claim 2, wherein the control clock generation circuit is configured to, when the read command is synchronized with the first inverted internal clock:
output the first internal clock as the first toggling reference clock during a period in which the second toggling reference period signal is activated; and
output the first inverted internal clock as the second toggling reference clock during a period in which the first toggling reference period signal is activated.

4. The apparatus according to claim 2, further comprising:
a period signal generation circuit configured to, when the read operation is performed, activate the first toggling reference period signal at an ending time point of a read latency period and activate the second toggling reference period signal later than the first toggling reference period signal.

5. The apparatus according to claim 1, wherein the strobe signal generation circuit is configured to set the data strobe signal to a first logic level in synchronization with the first and second toggling reference clocks.

6. The apparatus according to claim 1, wherein:
the control clock generation circuit is configured to generate a first toggling delay clock from a second internal clock and generate a second toggling delay clock from a second inverted internal clock, when the read operation is performed; and
the strobe signal generation circuit is configured to generate the data strobe signal whose level transitions during the toggling period in synchronization with the first and second toggling delay clocks, wherein a generation sequence of the first and second toggling delay clocks is changed depending on with which one of the first internal clock and the first inverted internal clock the read command is synchronized.

7. The apparatus according to claim 6, further comprising:
an internal clock generation circuit configured to generate the first internal clock, the second internal clock, the first inverted internal clock and the second inverted internal clock having a phase difference of 90 degrees from each other, based on a clock.

8. The apparatus according to claim 6, wherein the strobe signal generation circuit is configured to set the data strobe signal to a second logic level in synchronization with the first and second toggling delay clocks.

9. The apparatus according to claim 6, further comprising:
a data output circuit configured to output data by serializing read data in synchronization with the first and second toggling reference clocks and the first and second toggling delay clocks.

10. The apparatus according to claim 1, wherein:
the control clock generation circuit is configured to output one of the first internal clock and the first inverted internal clock as a preamble reference clock depending on with which one of the first internal clock and the first inverted internal clock the read command is synchronized; and
the strobe signal generation circuit is configured to generate the data strobe signal whose level transitions during a preamble period in synchronization with the preamble reference clock.

11. The apparatus according to claim 10, wherein:
the control clock generation circuit is configured to output one of a second internal clock and a second inverted internal clock as a preamble delay clock depending on with which one of the first internal clock and the first inverted internal clock the read command is synchronized; and
the strobe signal generation circuit is configured to generate the data strobe signal whose level transitions during the preamble period in synchronization with the preamble delay clock.

12. The apparatus according to claim 10, wherein:
the control clock generation circuit is configured to output one of the first internal clock and the first inverted internal clock as a postamble reference clock depending on with which one of the first internal clock and the first inverted internal clock the read command is synchronized; and
the strobe signal generation circuit is configured to generate the data strobe signal whose level transitions during a postamble period in synchronization with the postamble reference clock.

13. The apparatus according to claim 12, wherein:
the control clock generation circuit is configured to output one of a second internal clock and a second inverted internal clock as a postamble delay clock depending on with which one of the first internal clock and the first inverted internal clock the read command is synchronized; and
the strobe signal generation circuit is configured to generate the data strobe signal whose level transitions during the postamble period in synchronization with the postamble delay clock.

14. An apparatus comprising:
a control clock generation circuit configured to generate a first toggling reference clock from a first internal clock and generate a second toggling reference clock from a first inverted internal clock, when a read operation is performed; and a data output circuit configured to output read data as data in synchronization with the first and second toggling reference clocks, wherein a generation sequence of the first and second toggling reference clocks is changed depending on with which one of the first internal clock and the first inverted internal clock a read command for the read operation is synchronized.

15. The apparatus according to claim 14, wherein the control clock generation circuit is configured to, when the read command is synchronized with the first internal clock:
    output the first internal clock as the first toggling reference clock during a period in which a first toggling reference period signal is activated; and
    output the first inverted internal clock as the second toggling reference clock during a period in which a second toggling reference period signal is activated, wherein the first and second toggling reference period signals are sequentially activated when the read operation is performed.

16. The apparatus according to claim 15, wherein the control clock generation circuit is configured to, when the read command is synchronized with the first inverted internal clock:
    output the first internal clock as the first toggling reference clock during a period in which the second toggling reference period signal is activated; and
    output the first inverted internal clock as the second toggling reference clock during a period in which the first toggling reference period signal is activated.

17. The apparatus according to claim 15, further comprising a period signal generation circuit configured to, when the read operation is performed:
    activate the first toggling reference period signal at an ending time point of a read latency period; and
    activate the second toggling reference period signal later than the first toggling reference period signal.

18. The apparatus according to claim 14, wherein the data output circuit is configured to:
    output a first bit of the read data as the data in synchronization with the first toggling reference clock; and
    output a second bit of the read data as the data in synchronization with the second toggling reference clock.

19. The apparatus according to claim 14, wherein:
    the control clock generation circuit is configured to generate a first toggling delay clock from a second internal clock and generate a second toggling delay clock from a second inverted internal clock, when the read operation is performed; and
    the data output circuit is configured to output the read data as the data in synchronization with the first and second toggling delay clocks, wherein a generation sequence of the first and second toggling delay clocks is changed depending on with which one of the first internal clock and the first inverted internal clock the read command is synchronized.

20. The apparatus according to claim 19, wherein the data output circuit is configured to:
    output a third bit of the read data as the data in synchronization with the first toggling delay clock; and
    output a fourth bit of the read data as the data in synchronization with the second toggling delay clock.

* * * * *